United States Patent
Yang

(10) Patent No.: US 10,957,549 B2
(45) Date of Patent: Mar. 23, 2021

(54) METHODS OF FORMING SEMICONDUCTOR DEVICES USING MASK MATERIALS, AND RELATED SEMICONDUCTOR DEVICES AND SYSTEMS

(71) Applicant: Micron Technology, Inc., Boise, ID (US)

(72) Inventor: Guangjun Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 16/154,088

(22) Filed: Oct. 8, 2018

(65) Prior Publication Data

US 2020/0111673 A1 Apr. 9, 2020

(51) Int. Cl.
| | | |
|---|---|---|
| *H01L 21/308* | (2006.01) | |
| *H01L 21/764* | (2006.01) | |
| *H01L 25/18* | (2006.01) | |
| *H01L 21/033* | (2006.01) | |
| *H01L 21/768* | (2006.01) | |

(52) U.S. Cl.
CPC ...... *H01L 21/3086* (2013.01); *H01L 21/0332* (2013.01); *H01L 21/0337* (2013.01); *H01L 21/764* (2013.01); *H01L 21/76832* (2013.01); *H01L 25/18* (2013.01)

(58) Field of Classification Search
CPC ............ H01L 21/3086; H01L 21/0332; H01L 21/0337; H01L 21/764; H01L 21/76832; H01L 25/18
See application file for complete search history.

(56) References Cited

U.S. PATENT DOCUMENTS

| | | |
|---|---|---|
| 6,316,169 B1 | 11/2001 | Vahedi et al. |
| 6,541,360 B1 | 4/2003 | Plat et al. |
| 7,682,986 B2 | 3/2010 | Chi et al. |
| 7,910,288 B2 | 3/2011 | Abatchev et al. |
| 8,871,528 B2 | 10/2014 | Rubin et al. |
| 9,754,946 B1 | 9/2017 | Yang et al. |
| 2006/0046391 A1* | 3/2006 | Tang ................. H01L 29/42392 438/268 |
| 2006/0046484 A1* | 3/2006 | Abatchev ............ H01L 21/0332 438/689 |
| 2007/0232067 A1 | 10/2007 | Hirota et al. |
| 2009/0032963 A1* | 2/2009 | Tran .................. H01L 21/02164 257/774 |

(Continued)

*Primary Examiner* — Fernando L Toledo
*Assistant Examiner* — Neil R Prasad
(74) *Attorney, Agent, or Firm* — TraskBritt

(57) ABSTRACT

A method of forming a semiconductor device comprises patterning a mask material adjacent to an array of transistors, forming an electrically conductive material between adjacent portions of the patterned mask material, forming an additional mask material over the patterned mask material to form a mask structure, the additional mask material having an arcuate cross-sectional shape, removing a portion of the additional mask material to reduce a spacing between adjacent portions of the additional mask material, and forming capacitor structures in openings between the mask structure. Additional methods of forming a semiconductor device, and related semiconductor devices and related systems are also disclosed.

23 Claims, 14 Drawing Sheets

(56) References Cited

U.S. PATENT DOCUMENTS

| | | | |
|---|---|---|---|
| 2009/0035584 A1* | 2/2009 | Tran | H01L 21/0337 |
| | | | 428/446 |
| 2011/0163420 A1 | 7/2011 | Valdivia et al. | |
| 2015/0064914 A1* | 3/2015 | Kong | H01J 37/32082 |
| | | | 438/696 |
| 2018/0053821 A1* | 2/2018 | Mallela | H01L 21/764 |

* cited by examiner

METHODS OF FORMING SEMICONDUCTOR DEVICES USING MASK MATERIALS, AND RELATED SEMICONDUCTOR DEVICES AND SYSTEMS

TECHNICAL FIELD

Embodiments disclosed herein relate to semiconductor devices and to related methods of forming semiconductor devices. More particularly, embodiments of the disclosure relate to methods of forming a semiconductor device including adding a height to a mask material, such as by patterning a mask material over a semiconductor device to form a patterned mask material, forming at least a portion of the semiconductor device through the patterned mask material, and adding an additional mask material over the patterned mask material, and to related methods, related devices, and related systems.

BACKGROUND

Fabrication of semiconductor devices includes forming (e.g., patterning) one or more materials to have a desired size and spacing. For example, conductive materials may be patterned into conductive lines, such as access lines (e.g., word lines), digit lines (e.g., sense lines, bit lines), conductive contacts, and conductive traces. Other features may be patterned to form, for example, select devices of memory cells, memory storage elements, and other components of semiconductor devices.

As the feature size of semiconductor devices continues to shrink, it is more and more difficult to form patterns of features having a desired critical dimension. In addition, as the complexity of semiconductor devices increases, stack structures including materials to be patterned may exhibit a greater thickness (e.g., height). Further, as the number of patterning acts increases due to the increased complexity of semiconductor devices, a dimension (e.g., a height) or an aspect ratio (defined as a ratio between a height and a width of a structure) of mask materials, such as photoresist materials and hard mask materials, may increase to facilitate patterning of a desired number of features of the semiconductor device. However, as the height and/or aspect ratio of the mask material increases, materials formed through the mask may exhibit an undesired increase in spacer width roughness (SWR), a line width roughness (LWR), or a combination thereof. In addition, as the height of the mask material increases, the mask material may exhibit a lateral opening at a top portion thereof that is greater than a lateral width at a lower portion thereof. Accordingly, the mask material may exhibit so-called tapering and materials formed through the mask material may exhibit a corresponding taper, which may result in formation of a structure having a different spacing or critical dimension than desired. The tapered structures may exhibit a greater lateral dimension at upper portions thereof and a relatively narrower dimension at lower portions thereof.

During formation of features in the semiconductor device, a height of the mask material may be reduced during exposure of the mask material to various etch chemistries, even if the etch chemistries are formulated and configured to selectively remove other portions of the semiconductor device relative to the mask material. Accordingly, forming the mask material to an initial lower height to overcome the problems of tapering and increased spacer width roughness may not be a feasible alternative, since a mask material having a relatively shorter height may be insufficient for fabrication of the semiconductor device.

DETAILED DESCRIPTION

Figure 1A:
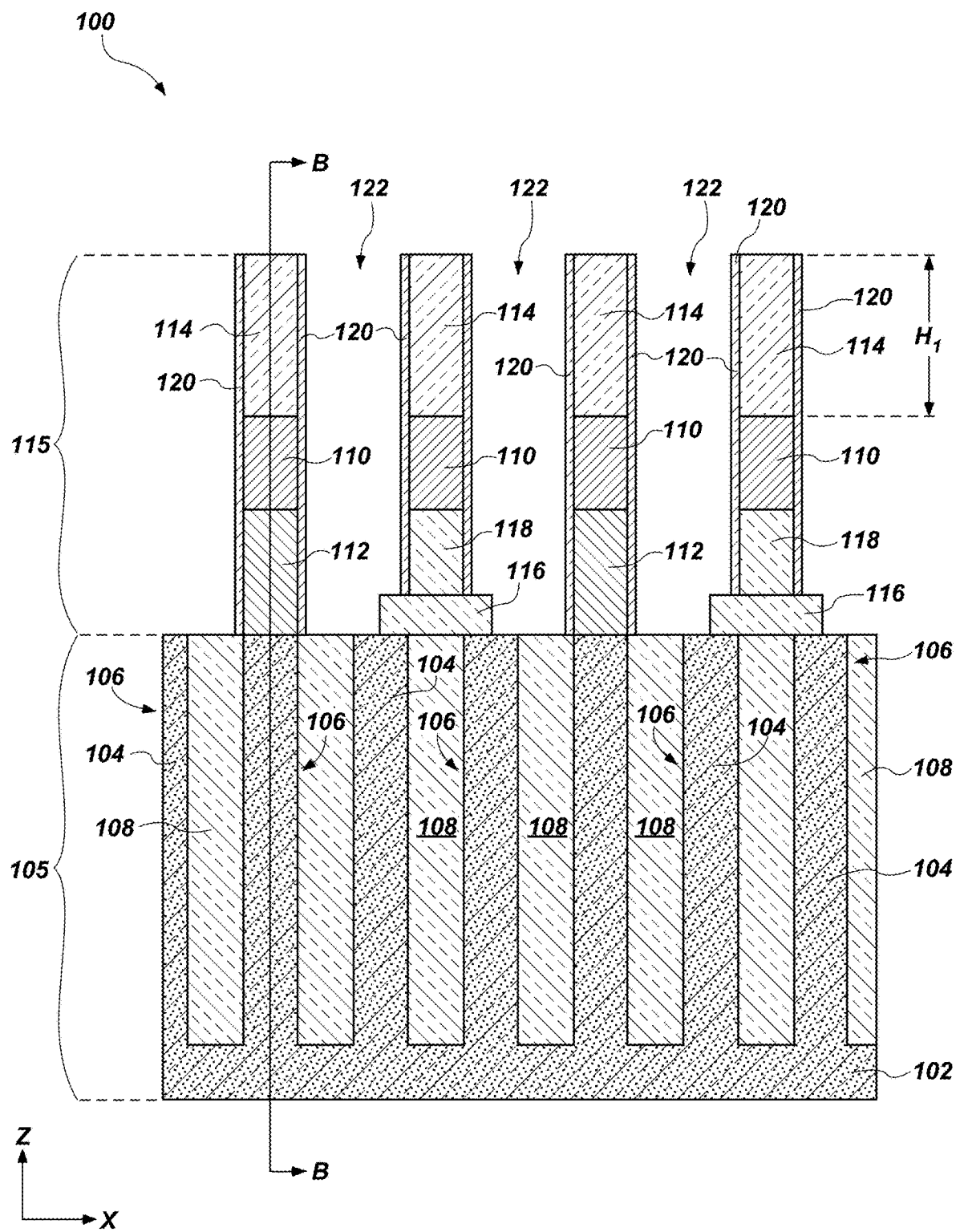
FIG. 1A through FIG. 1G are simplified cross-sectional (FIG. 1A, FIG. 1B, and FIG. 1D through FIG. 1G) and a top view (FIG. 1C) of a semiconductor device during various fabrication acts and illustrate a method of forming the semiconductor device, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device, a semiconductor device including a mask material, or a complete description of a process flow for fabricating such semiconductor devices. The structures described below do not form complete semiconductor device structures. Only those process acts and structures necessary to understand the embodiments described herein are described in detail below. Additional acts to form a complete semiconductor device or mask materials during fabrication of the semiconductor devices may be performed by conventional techniques.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

According to embodiments described herein, a semiconductor device comprises an array of transistors arranged in a pattern over or within a base material. Electrically conductive lines (e.g., digit lines, sense lines, bit lines) may extend over the array of transistors. Electrically conductive contacts may electrically couple the electrically conductive lines to the transistors. The transistors may also be in electrical communication with a memory storage element, such as with a capacitor structure through other electrically conductive contacts. A mask structure may overlie at least the electrically conductive lines. The mask structure may include, for example, a silicon nitride material, a metal material, silicon dioxide, a photoresist material, a silicon-containing material doped with carbon, another material, or combinations thereof. In some embodiments, the mask structure comprises silicon nitride. The mask structure may include a first portion, a second portion, and an interface between the first portion and the second portion. In some embodiments, the first portion and the second portion have substantially the same composition. In some embodiments, the first portion and the second portion comprise the same elements, comprise the same atomic percent of the elements thereof (i.e., have the same stoichiometry), or both. The interface may exhibit a higher atomic percent of oxygen than the first portion and the second portion. By way of nonlimiting example, the first portion and the second portion may comprise silicon nitride, and the interface may comprise silicon nitride having at least some oxidized portions. In some such embodiments, the interface may comprise silicon oxynitride ($SiO_xN_y$, wherein x is between about 0.01 and about 0.5 and y is between about 0.01 and about 1.0).

The semiconductor device may be formed by forming an array of transistors over a base material, such as a substrate. Features of a semiconductor device (e.g., features of a memory cell, a memory material, etc.), such as capacitor structures, may be formed (e.g., patterned) over the array of transistors. In some embodiments, each transistor is operably coupled to a capacitor structure to form a memory cell. The capacitor structures may be arranged in a pattern that may be different or offset from the pattern of the array of transistors. The capacitor structures may be operably coupled to the transistors through electrically conductive contacts. Electrically conductive lines may extend over the array of transistors and may be coupled thereto with other electrically conductive contacts. A mask material may overlie the electrically conductive lines and may be used during formation of the capacitor structures, other components of the semiconductor device, or a combination thereof. Since a height of the mask material may be reduced (e.g., consumed) during various fabrication acts of different components of the semiconductor device, in some embodiments, at least one additional mask material is formed over the mask material to form a mask structure having a desired height and aspect ratio. The additional mask material may be formed by, for example, physical vapor deposition, plasma enhanced chemical vapor deposition, another deposition method, or combinations thereof. After forming the additional mask material over the mask material, the additional mask material may be exposed to a removal chemistry (e.g., an etch chemistry, a trimming chemistry) to pattern the additional mask to have substantially the same lateral width as the initial mask material and to maintain a critical dimension of the mask structure. Additional features may be formed using the resulting mask structure. Additional mask materials may be formed over the mask structure for additional fabrication acts, if desired. Accordingly, additional mask materials may be formed over the mask structure a desired number of times to increase a height and an aspect ratio of the mask structure, depending on features and arrangement thereof to be formed in the semiconductor device. The number of times that additional mask material is added to the mask structure may be tailored depending on the number of features to be formed through the mask material.

Accordingly, a semiconductor device may be fabricated using a mask structure. A height of an initial mask material through which features of the semiconductor device are formed may be less than a height of mask materials used during conventional semiconductor fabrication processes. The reduced mask height may facilitate fabrication of features formed using the initial mask material having a reduced spacer width roughness, line width roughness, and reduced tapering (e.g., substantially perpendicular sidewalls) relative to features formed using a conventional mask material having a relatively higher height and corresponding aspect ratio. After forming of the features, additional mask material may be formed over the initial mask material to form a mask structure having an increased height relative to the initial mask material. Additional features may be formed in a desired pattern using the resulting mask structure. Accordingly, a height and aspect ratio of the mask structure may be controlled during formation of various features within the semiconductor device. Accordingly, a spacer width roughness, line width roughness, and amount of tapering of the features may be reduced based on the height of the mask structure.

FIG. 1A is a simplified cross-sectional view of a semiconductor device, in accordance with embodiments of the disclosure. The semiconductor device 100 includes a base material 102, such as a substrate in which active regions 104 are formed. The base material 102 may be a base material or a construction upon which additional materials are formed. The base material 102 may be a semiconductor substrate, a base semiconductor layer on a supporting structure, a metal electrode or a semiconductor substrate having one or more layers, structures or regions formed thereon. The base material 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material 102 may be doped or undoped.

As will be described herein, the active regions 104 may include a doped semiconductor material, such as regions doped with N-type conductivity materials and other regions doped with P-type conductivity materials. As used herein, an N-type conductivity material may include, for example, polysilicon doped with at least one N-type dopant (e.g., arsenic ions, phosphorous ions, antimony ions). As used herein, a P-type conductivity material may include, for example, polysilicon doped with at least one P-type dopant (e.g., boron ions). The active regions 104 may comprise a portion of a transistor for accessing one or more components of, for example, a memory cell.

The active regions 104 may be formed within the base material 102 and may comprise pillars 106 extending from a lower portion of the base material 102 in a substantially vertical direction. At least some of the pillars 106 may be in electrical communication with memory storage elements (e.g., capacitor structures) and at least some of the pillars 106 may be in electrical communication with access lines (e.g., digit lines), as will be described herein.

An electrically insulative material 108 may separate adjacent pillars 106 of the active regions. The electrically insulative material 108 may comprise a dielectric material, such as, for example, silicon dioxide, silicon nitride, phosphosilicate glass, borosilicate glass, borophosphosilicate glass, another electrically insulative material, or combinations thereof. In some embodiments, the electrically insulative material 108 comprises silicon dioxide.

Electrically conductive lines 110 may overlie the pillars 106. Electrically conductive interconnects 112 may electrically couple at least some of the first electrically conductive lines 110 to the pillars 106. Some of the electrically conductive interconnects 112 may directly overlie and contact a pillar 106 and at least some of electrically conductive interconnects 112 may be separated from underlying pillars 106, as shown in the cross-sectional view illustrated in FIG. 1B. In some embodiments, the electrically conductive lines 110 that are not illustrated in electrical communication with the underlying pillars 106 in the view illustrated in FIG. 1B may be in electrical communication with the underlying pillars 106 in a different cross-section than that illustrated.

The first electrically conductive lines 110 may comprise an electrically conductive material. As used herein, an "electrically conductive material" refers to one or more of a metal, such as tungsten, titanium, cobalt, nickel, platinum, ruthenium, aluminum, copper, molybdenum, gold, or combinations thereof, a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), elemental ruthenium (Ru), ruthenium oxide ($RuO_x$), elemental tungsten (W), elemental aluminum (Al), elemental copper (Cu), elemental gold (Au), elemental silver (Ag), polysilicon, alloys thereof, or combinations thereof. In some embodiments, the first electrically conductive lines 110 comprise titanium nitride.

The electrically conductive interconnect 112 may comprise an electrically conductive material. In some embodiments, the electrically conductive interconnect 112 comprises tungsten, although the disclosure is not so limited and the electrically conductive interconnect 112 may comprise other conductive materials. In some embodiments, the electrically conductive interconnect 112 comprises the same material as the first electrically conductive lines 110. In other embodiments, the electrically conductive interconnect 112 comprise a different material than the first electrically conductive lines 110.

A mask material 114 may overlie and contact the electrically conductive lines 110. The mask material 114 may comprise an electrically insulative material, such as, for example, silicon dioxide, silicon nitride, phosphosilicate glass, borosilicate glass, borophosphosilicate glass, another electrically insulative material, or combinations thereof. In other embodiments, the mask material 114 comprises a metal material. In some embodiments, the mask material 114 comprises silicon nitride. The mask material 114 may be referred to herein as a "cap" or an "insulative cap." The mask material 114 may also be referred to herein as an "initial mask material."

A height $H_1$ of the mask material 114 may be between about 500 Å and about 1,500 Å, such as between about 500 Å and about 750 Å, between about 750 Å and about 1,000 Å, between about 1,000 Å and about 1,250 Å, or between about 1,250 Å and about 1,500 Å. In some embodiments, the height $H_1$ is between about 800 Å and about 900 Å, such as about 850 Å.

The first electrically conductive lines 110 that are not in electrical communication with the underlying pillars 106 in the cross-sectional view of FIG. 1A may be spaced from the underlying pillars by a first electrically insulative material 116 and a second electrically insulative material 118.

Each of the first electrically insulative material 116 and the second electrically insulative material 118 may individually comprise an electrically insulative material, such as, for example, silicon dioxide, silicon nitride, phosphosilicate glass, borosilicate glass, borophosphosilicate glass, another electrically insulative material, or combinations thereof. In some embodiments, the first electrically insulative material 116 and the second electrically insulative material 118 comprise the same material. In other embodiments, the first electrically insulative material 116 and the second electrically insulative material 118 comprise a different material.

A liner 120 may overlie sidewalls of the electrically conductive interconnect 112, the electrically conductive lines 110, and the mask material. The liner 120 may overlie sidewalls of the second electrically insulative material 118, the electrically conductive lines 110, and the mask material 114. The liner 120 may comprise an electrically insulative material, such as, for example, silicon nitride.

The electrically conductive lines 110 may be isolated from each other by openings 122. The liner 120 may be adjacent to (e.g., overlie) sidewalls defining the openings 122.

With continued reference to FIG. 1A, the semiconductor device 100 may include a first portion 105 and a second portion 115 overlying the first portion 105. The first portion 105 may include the pillars 106 arranged in a first pattern. At least some of the pillars 106 may comprise transistors and, therefore, the first portion 105 may be referred to herein as a "transistor region."

Figure 1B:
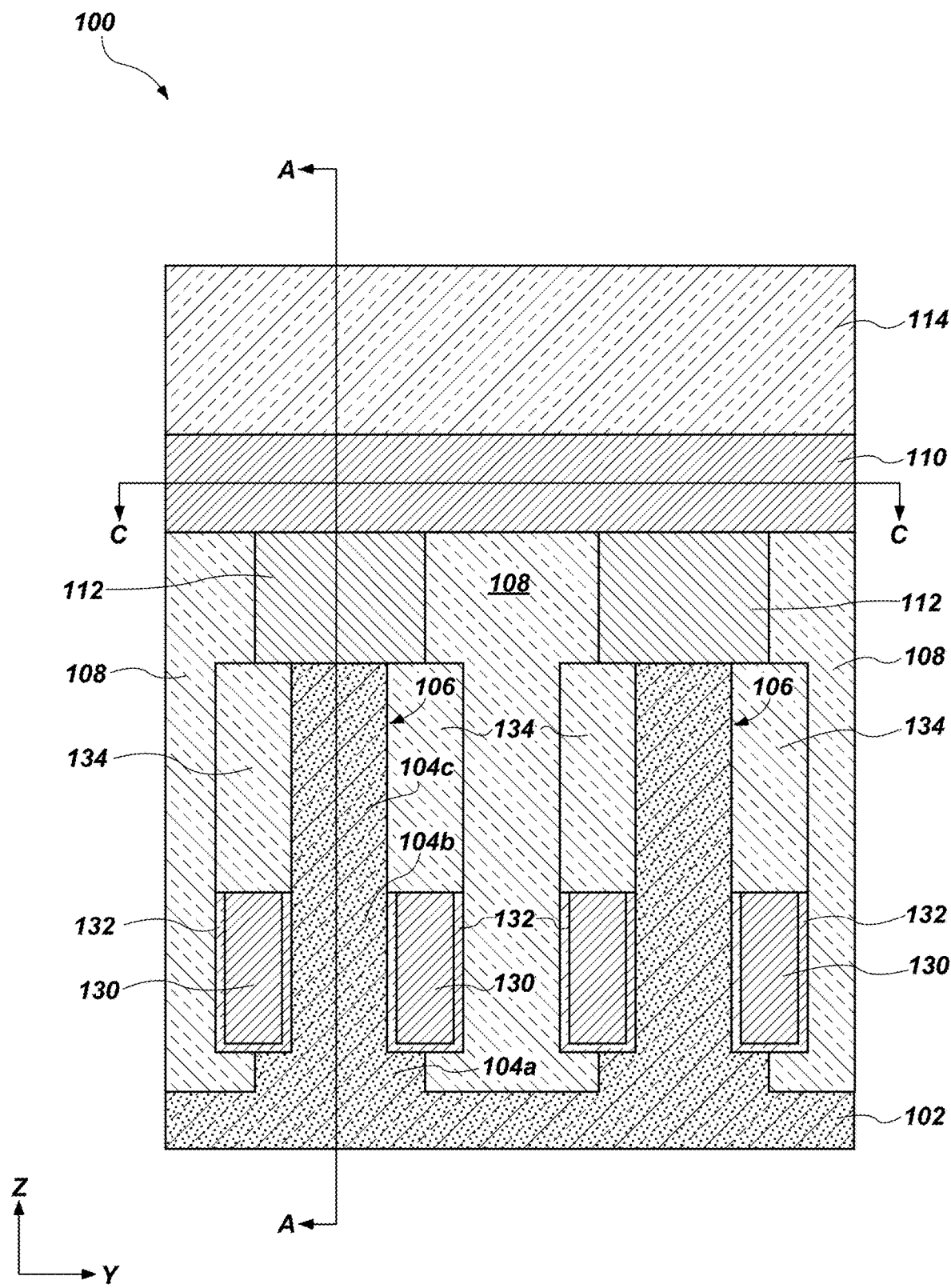

FIG. 1B is a simplified cross-sectional view of the semiconductor device 100 taken along section line B-B of FIG. 1A. With reference to FIG. 1B, the pillars 106 may include gate electrodes 130 extending along sides thereof. In some embodiments, each pillar 106 may include a gate electrode 130 extending along each side thereof. In some such embodiments, the pillar 106 may form a portion of a transistor having a dual gate electrode structure.

The gate electrodes 130 may extend over sidewalls of at least one of a channel region 104b and may, in some embodiments, extend over at least a portion of each of a source region 104a and a drain region 104c. However, the disclosure is not so limited and in other embodiments, the gate electrodes 130 may not extend over sidewalls of the source region 104a and the drain region 104c and may extend over only sidewalls of the channel region 104b. In some embodiments, the channel region 104b comprises one of a p-type conductivity material and an n-type conductivity material and each of the source region 104a and the drain region 104c comprise the other of the p-type conductivity material and the n-type conductivity material. The source region 104a, the channel region 104b, and the drain region 104c may form a transistor structure.

The gate electrodes 130 may comprise an electrically conductive material. The gate electrodes 130 may be referred to herein as "word lines" and may extend in a direction that is substantially perpendicular to a direction in which the electrically conductive lines 110 extend.

A gate dielectric material 132 may be located between the gate electrodes 130 and the pillars 106, such as between the gate electrodes 130 and at least the channel regions 104b. The gate dielectric material 132 may surround at least sides of the gate electrodes 130.

The gate dielectric material 132 may include electrically insulative materials, such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), a dielectric carboxynitride material (e.g., silicon carboxynitride (SiOCN))), or combinations thereof.

In the cross-sectional view of FIG. 1B, adjacent pillars 106 may be separated from each other at least by the electrically insulative material 108. Another electrically insulative material 134 may overlie sidewalls of the pillars 106 at regions above the gate electrodes 130. The another electrically insulative material 134 may comprise, for example, silicon dioxide, silicon nitride, phosphosilicate glass, borosilicate glass, borophosphosilicate glass, another electrically insulative material, or combinations thereof.

As described above with reference to FIG. 1A, the electrically conductive interconnects 112 may overlie the pillars 106 and may be in electrical communication with the at least some of the electrically conductive lines 110. The mask material 114 may extend as lines and may be substantially collinear with the electrically conductive lines 110.

Figure 1C:
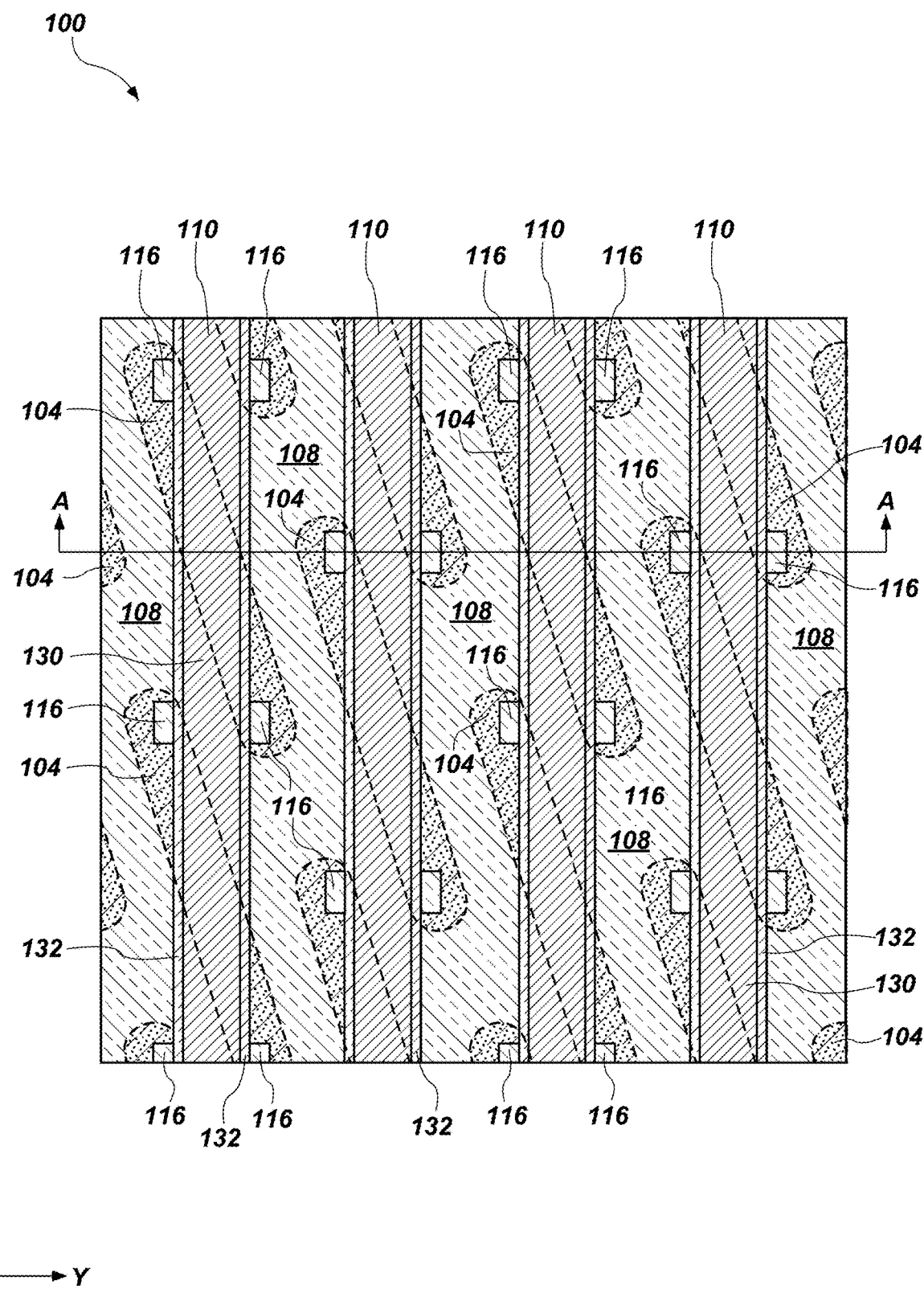

FIG. 1C is a simplified top view of the semiconductor device 100 and illustrating a layout of different features of the semiconductor device 100. The semiconductor device 100 may include the active regions 104 extending at an angle relative to the electrically conductive lines 110. In some embodiments, the angle is not substantially perpendicular. In some embodiments, the gate electrodes 130 (FIG. 1B) may extend at an angle that is substantially perpendicular to the direction of the electrically conductive lines 110.

Figure 1D:
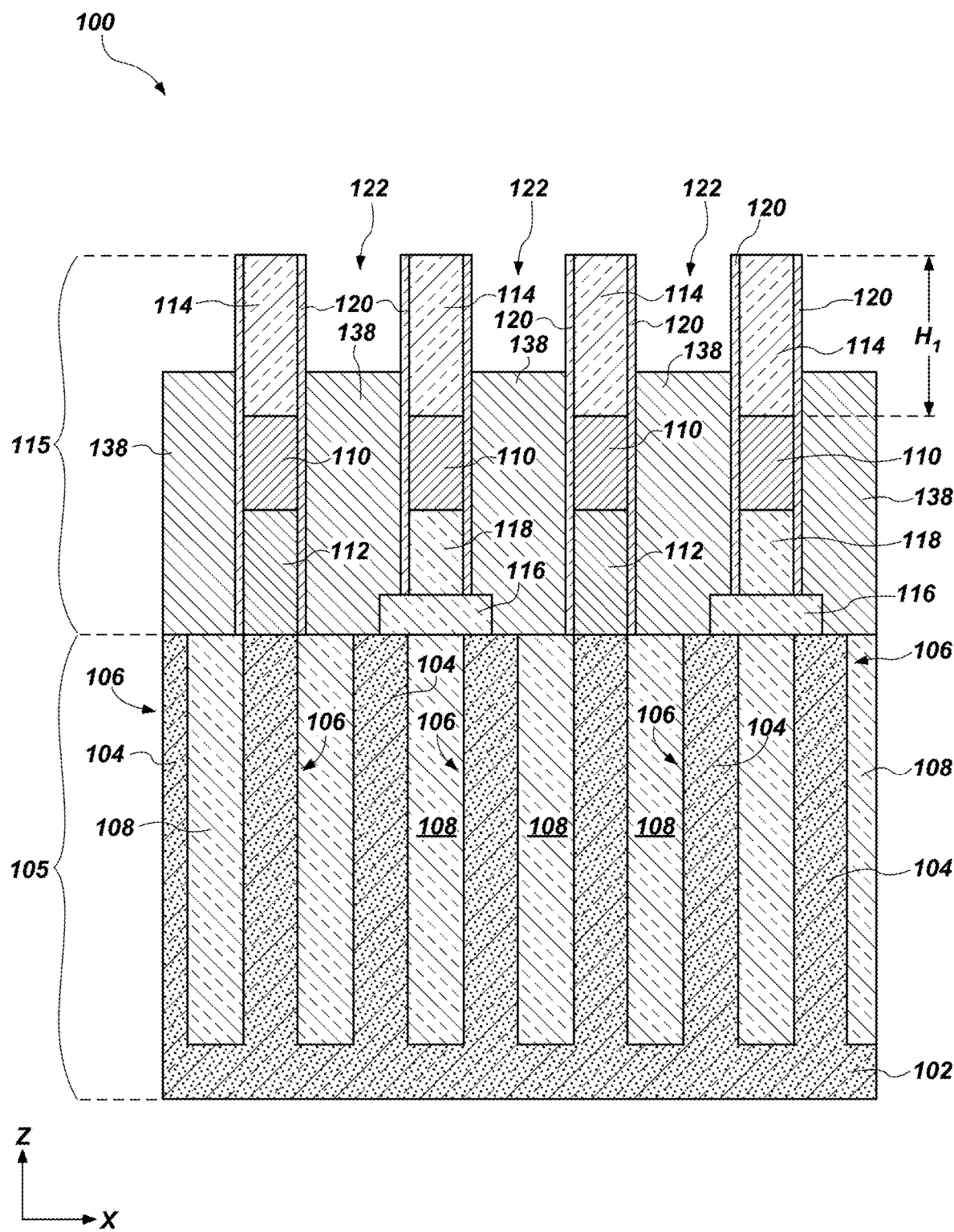

FIG. 1D is a simplified cross-sectional view of the semiconductor device 100 illustrating the same cross-section of FIG. 1A, after different fabrication acts have been performed. An electrically conductive material 138 may be formed within the openings 122 and may fill at least a portion of the openings 122. In some embodiments, an upper surface of the electrically conductive material 138 may be located below an upper surface of the mask material 114. In some embodiments, the electrically conductive material 138 may be formed (e.g., deposited) in the openings 122 and a portion thereof may be removed by exposing the semiconductor device 100 to an etch chemistry. In other embodiments, the upper surface of the electrically conductive material 138 may be substantially coplanar with the upper surface of the mask material 114.

In some embodiments, the electrically conductive material 138 may be formed to have a pattern different than the pattern of the electrically conductive lines 110 and the gate electrodes 130. For example, in some embodiments, intersections of the gate electrodes 130 and the electrically conductive lines 110 may be arranged in a substantially perpendicular orientation with rows (e.g., the gate electrodes 130) and columns (e.g., the electrically conductive lines 110) extending in mutually perpendicular directions and the electrically conductive material 138 may be arranged in a hexagonal close-packed orientation. However, the disclosure is not so limited and the electrically conductive material 138, the electrically conductive lines 110, and the gate electrodes 130 may be configured in different patterns than those described above.

The electrically conductive material 138 may comprise an electrically conductive interconnect and may be in electrical connection with the underlying pillars 106. The electrically conductive material 138 may comprise, for example, tungsten, although the disclosure is not so limited and the electrically conductive material 138 may include other electrically conductive materials.

Figure 1E:
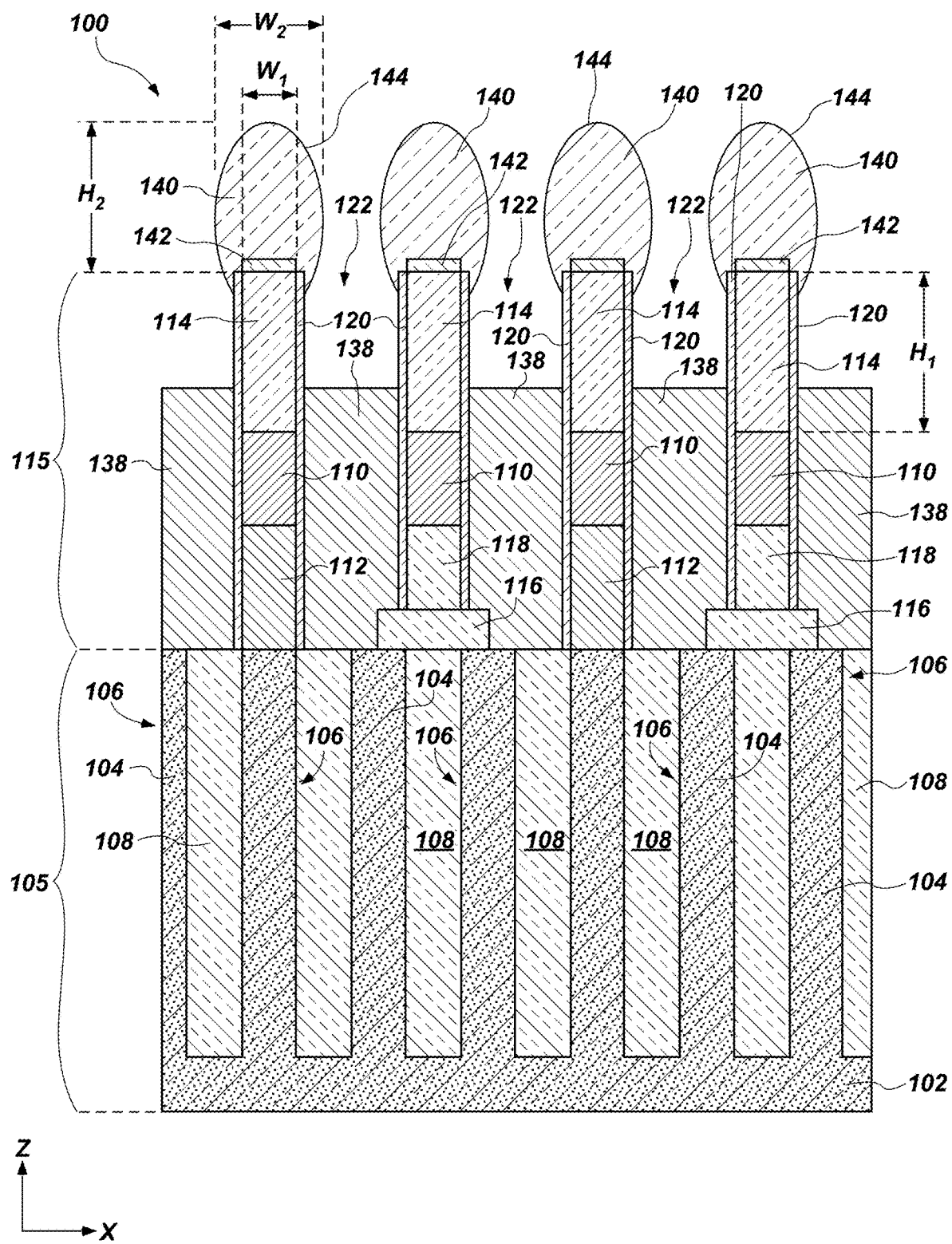

With reference to FIG. 1E, an additional mask material 140 may be formed directly over and in contact with the mask material 114. In some embodiments, the additional mask material 140 may comprise the same material as the mask material 114. In other embodiments, the additional mask material 140 comprises a material different than the mask material 114. The additional mask material 140 may include silicon dioxide, silicon nitride, phosphosilicate glass, borosilicate glass, borophosphosilicate glass, another electrically insulative material, or combinations thereof. In some embodiments, the additional mask material 140 comprises silicon nitride. In some embodiments, each of the mask material 114 and the additional mask material 140 comprises silicon nitride.

An interface 142 between the mask material 114 and the additional mask material 140 may exhibit a different composition than each of the mask material 114 and the additional mask material 140. In FIG. 1E, the dimensions and configuration of the interface 142 are exaggerated for clarity. In some embodiments, the interface 142 may exhibit a greater atomic percent of oxygen than either of the mask material 114 and the additional mask material 140. By way of nonlimiting example, where the mask material 114 and the additional mask material 140 comprise silicon nitride, the interface 142 may comprise silicon oxynitride (SiON). An atomic percent of oxygen in the interface 142 may be between about 0.1 atomic percent and about 5.0 atomic percent, such as between about 0.1 atomic percent and about 0.25 atomic percent, between about 0.25 atomic percent and about 0.5 atomic percent, between about 0.5 atomic percent and about 1.0 atomic percent, between about 1.0 atomic percent and about 2.0 atomic percent, between about 2.0 atomic percent and about 3.0 atomic percent, or between about 3.0 atomic percent and about 5.0 atomic. The interface 142 may be visually observed, such as with scanning electron microscopy (SEM) or scanning transmission electron microscopy (STEM).

The additional mask material 140 may extend as lines along surfaces of the first mask material 114. In other words, the additional mask material 140 may extend in lines in the y-direction (in and out of the plane in the view illustrated in FIG. 1E).

The additional mask material 140, as formed, may include an arcuate surface 144. The arcuate surface 144 may also be referred to herein as a so-called "bulbous" surface. Accordingly, the additional mask material 140 may have an arcuate cross-sectional shape.

A height $H_2$ of the additional mask material 140 may be between about 100 Å and about 300 Å, such as between about 100 Å and about 150 Å, between about 150 Å and about 200 Å, between about 200 Å and about 250 Å, or between about 250 Å and about 300 Å. In some embodiments, the height $H_2$ is about 180 Å. However, the disclosure is not so limited and the height $H_2$ may be different than that described above.

The additional mask material 140 may be formed by, for example, ALD, CVD, PVD, LPCVD, PECVD, or another method. In some embodiments, the additional mask material 140 is formed by PVD. In some such embodiments, the additional mask material 140 may be formed with a silicon nitride ($Si_3N_4$) target within the PVD chamber. In some such embodiments, a pressure within a deposition chamber may be between about 2 milliTorr (mTorr) and about 10 mTorr, such as between about 2 mTorr and about 4 mTorr, between about 4 mTorr and about 6 mTorr, or between about 6 mTorr and about 10 mTorr. In some embodiments, the pressure may be about 5 mTorr during formation of the additional mask material 140.

In some embodiments, a radiofrequency (RF) of the PVD chamber in which the additional mask material 140 is formed may be between about 10.0 MHz and about 16.0 MHz, such as between about 10.0 MHz and about 12.0 MHz, between about 13.0 MHz and about 14.0 MHz, or between about 14.0 MHz and about 16.0 MHz. In some embodiments, the RF is about 13.5 MHz. The RF power may be between about 400 W and about 600 W, such as between about 400 W and about 500 W, or between about 500 W and about 600 W. In some embodiments, the RF power is about 500 W. A temperature of the PVD chamber may be between about 50° C. and about 150° C., such as between about 50° C. and about 100° C., or between about 100° C. and about 150° C. In some embodiments, the temperature is about 100° C. The PVD chamber may include one or more inert gases therein. By way of example, the deposition chamber may include nitrogen, argon, or a combination thereof therein during formation of the additional mask material 140. In some embodiments, a flow rate of nitrogen in the PVD chamber is between about 40 sccm and about 80 sccm, such as between about 40 sccm and about 60 sccm, or between about 40 sccm and about 80 sccm. A flow rate of argon in the PVD chamber may be between about 40 sccm and about 60 sccm, such as between about 40 sccm and about 50 sccm, or between about 50 sccm and about 60 sccm. In some embodiments, a flow rate of nitrogen is about 60 sccm and a flow rate of argon is about 50 sccm.

In other embodiments, the additional mask material 140 is formed by plasma enhanced chemical vapor deposition. In some such embodiments, a pressure within the PECVD chamber may be between about 2 milliTorr (mTorr) and about 10 mTorr, such as between about 2 mTorr and about 4 mTorr, between about 4 mTorr and about 6 mTorr, or between about 6 mTorr and about 10 mTorr. In some embodiments, the pressure may be about 5 mTorr during formation of the additional mask material 140. The PECVD chamber may include a low frequency RF power and a high frequency RF power during formation of the additional mask material 140. The low frequency RF power may be between about 250 W and about 350 W, such as between about 250 W and about 300 W, or between about 300 W and about 350 W. The high frequency RF power may be between about 450 W and about 550 W, such as between about 450 W and about 500 W, or between about 500 W and about 550 W. In some embodiments, the low frequency power is about 300 W and the high frequency power is about 500 W. In embodiments where the additional mask material 140 comprises silicon nitride, the precursor materials may include $SiH_4$ and $NH_3$. By way of nonlimiting example, a flow rate of $SiH_4$ may be between about 600 sccm and about 800 sccm, such as between about 600 sccm and about 700 sccm, or between about 700 sccm and about 800 sccm and the flow rate of $NH_3$ may be between about 3,000 sccm and about 3,400 sccm, such as between about 3,000 sccm and about 3,200 sccm, or between about 3,200 sccm and about 3,400 sccm. A flow rate of an inert gas, such as nitrogen, may be between about 2,000 sccm and about 3,000 sccm, such as between about 2,000 sccm and about 2,500 sccm, or between about 2,500 sccm and about 3,000 sccm.

The additional mask material 140 may have a width $W_2$ that is greater than a width $W_1$ of the underlying first electrically insulative material 116. By way of nonlimiting example, the width $W_1$ may be between about 50 nm and about 200 nm, such as between about 50 nm and about 100 nm, between about 100 nm and about 150 nm, or between about 150 nm and about 200 nm. In some embodiments, the width $W_1$ is about 100 nm. The width $W_2$ may be between about 5 nm and about 25 nm greater than the width $W_1$, such as between about 5 nm and about 10 nm, between about 10 nm and about 15 nm, between about 15 nm and about 20 nm, or between about 20 nm and about 25 nm greater than the width $W_1$.

Figure 1F:
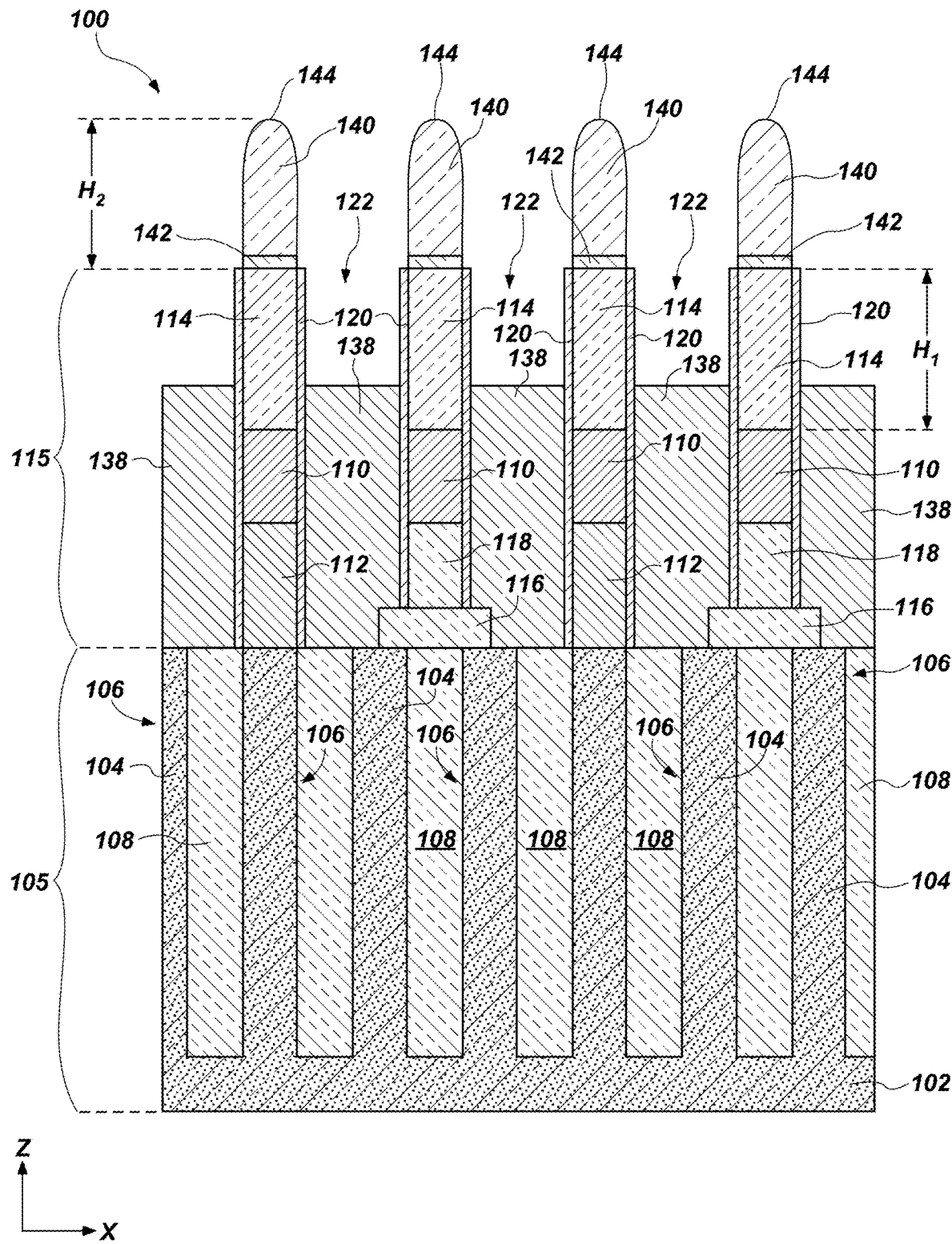

FIG. 1F is a simplified cross-sectional view of the semiconductor device 100 after removing at least a portion of the additional mask material 140 to reduce the width $W_2$ and to form a mask structure comprising the mask material 114 and the additional mask material 140. In some embodiments, the width $W_2$ may be reduced to be substantially equal to about the width $W_1$. In other words, sidewalls of the mask material 114 may be substantially aligned with sidewalls of the additional mask material 140. In some such embodiments, a critical dimension of the mask structure may be equal to about a critical dimension of the mask material 114. The portions of the additional mask material 140 may be removed by exposing the additional mask material 140 to a removal chemistry (e.g., an etch chemistry, a trimming chemistry). In some embodiments, the mask material 114 may not be substantially removed by the removal chemistry. For example, the mask material 114 may not include exposed sidewalls since the liner 120 over the sidewalls may protect the mask material 114 during removal of portions of the additional mask material 140.

The removal chemistry may comprise, for example, a gas comprising $CF_4$, $CH_3F$, $H_2$, $O_2$, HBr, $Cl_2$, $SF_6$, a fluorocarbon gas, another gas, or combinations thereof. By way of nonlimiting example, the removal chemistry may comprise a mixture of $O_2$ and $CF_4$, a mixture of $H_2$, $CF_4$, and $O_2$, a mixture of HBr, $Cl_2$, and $H_2$, a mixture of $CF_4$, $CHF_3$, and $O_2$, a mixture of $CF_4$, $O_2$, and $N_2$, a mixture of $CF_4$ and $H_2$, a mixture of $SF_6$, $O_2$, and $N_2$, a mixture of $SF_6$, $CH_4$, and $N_2$, or a mixture of $SF_6$, $CH_4$, $N_2$, and $O_2$.

Exposing the additional mask material 140 to the removal chemistry may form the additional mask material 140 to have a substantially uniform critical dimension with respect to the mask material 114. In some embodiments, side portions of the additional mask material 140 are removed such that sidewalls of the additional mask material 140 are substantially coplanar with sidewalls of the mask material. Portions of the additional mask material 140 on sidewalls of the mask material 114 may be removed from sidewalls of the mask material 114 during trimming of the additional mask material 140. In some embodiments, an angle at which the removal chemistry is directed to the semiconductor device 100 (e.g., the additional mask material 140) may be between about 45° and about 90°, such as between about 45° and about 60°, between about 60° and about 75°, or between about 75° and about 90° with respect to a vertical direction (e.g., with respect to the z-direction). In some embodiments, adding more additional mask material 140 to the mask structure may be repeated to form a mask structure having a desired height and aspect ratio.

Without wishing to be bound by any particular theory, it is believed that the etch angle may reduce an exposure of lower portions (e.g., lower sidewalls) of the mask material 114 to the etchant gases, which may reduce an amount that the sidewalls of the mask material 114 are removed by the trimming etch chemistry. In addition, since the as formed additional mask material 140 has a greater width $W_2$ than the mask material 114, the additional mask material 140 may be removed at a faster rate relative to the mask material 114. Accordingly, a sidewall profile and critical dimension of the mask material 114 may be maintained. In addition, where the semiconductor device 100 includes the liner 120, the liner 120 may protect the mask material 114 from removal during removal of portions of the additional mask material 140.

An aspect ratio of the additional mask material 140 and the mask material 114 may be between about 2:1 and about 15:1, such as between about 2:1 and about 4:1, between about 4:1 and about 6:1, between about 6:1 and about 10:1, or between about 10:1 and about 15:1. However, the disclosure is not so limited and the aspect ratio may be greater than that described above.

Although FIG. 1D describes forming the electrically conductive material 138 to be recessed relative to the mask material 114, the disclosure is not so limited. In other embodiments, an upper surface of the electrically conductive material 138 may be substantially coplanar with an upper surface of the mask material 114. In some such embodiments, the additional mask material 140 may be formed directly on the mask material 114 and at least a portion of the additional mask material 140 may extend laterally over and directly contact the electrically conductive material 138 before trimming of the additional mask material 140.

Figure 1G:
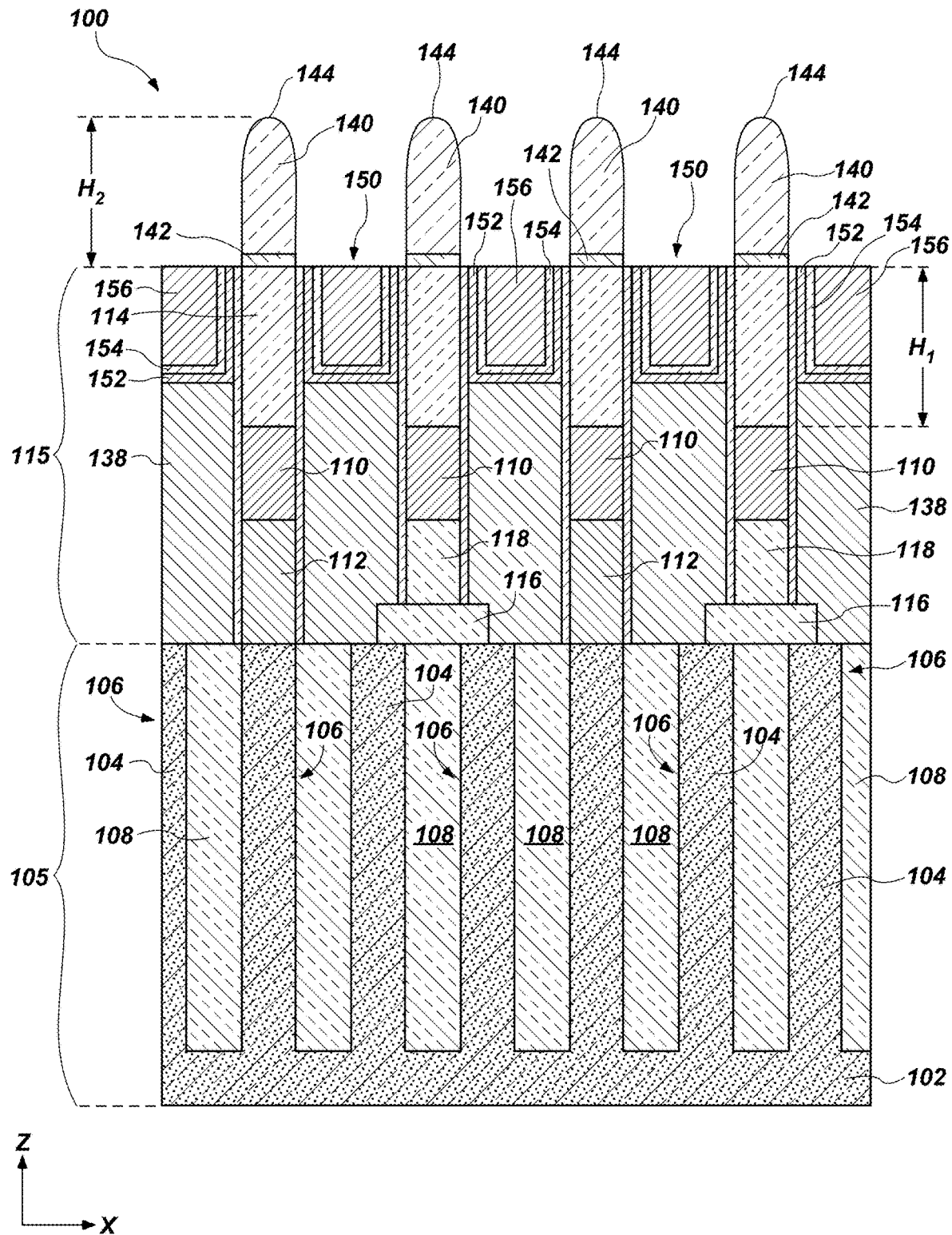

Referring to FIG. 1G, after removing (e.g., trimming) portions of the additional mask material 140, capacitor structures 150 may be formed within the openings 122. The capacitor structures 150 may be formed in electrical communication with the electrically conductive material 138. The capacitor structures 150 may be formed between adjacent portions of the mask material 114 and the additional mask material 140.

The capacitor structures 150 may include, for example, a lower electrode 152, an upper electrode 156, and a dielectric material 154 between the lower electrode 152 and the upper electrode 156.

The lower electrode 152 may be in electrical communication with the electrically conductive material 138. The lower electrode 152 may include a suitable electrically conductive material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the lower electrode 152 comprises titanium nitride.

The upper electrode 156 may comprise an electrically conductive material, such as one or more of the materials described above with reference to the lower electrode 152.

The dielectric material 154 may be configured to store a charge or other property associated with a logic state of the capacitor structure 150. Accordingly, the capacitor structure 150 may be referred to as a "cell capacitor" or a "storage capacitor." The dielectric material 154 may include silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), a high-k dielectric material, or combinations thereof. In some embodiments, the dielectric material 154 comprises zirconium oxide.

Forming the additional mask material 140 over the mask material 114 may facilitate fabrication of the semiconductor device 100 and may facilitate fabrication of components thereof (e.g., the capacitor structure 150, other features)

without having a relatively high spacer width roughness, line width roughness, tapered sidewalls, of such features. By way of nonlimiting example, the lower electrode 152, the dielectric material 154, and the upper electrode 156 may be formed through the additional mask material 140. In some embodiments, the mask structures may be used during formation of redistribution lines or other conductive materials.

Forming the additional mask material 140 may facilitate forming features of the semiconductor device 100 to have substantially uniform dimensions and sidewalls. For example, the features, such as the electrically conductive material 138, the capacitor structures 150, or other features, may be formed with a mask material (e.g., the mask material 114), during which formation, a height of the mask material 114 may be reduced. After the height of the mask material 114 is reduced during forming of various features of the semiconductor device 100, the additional mask material 140 may be formed over the mask material 114 to increase a height of a mask structure that includes the mask material 114 and the additional mask material 140. Since the height of the mask structure is increased, the mask structure may be used to form additional features of the semiconductor device 100. After fabrication of the capacitor structures 150 as described above, the additional mask material 140 may remain in the semiconductor device 100 and may be used to form additional features over the semiconductor device 100. For example, the additional mask material 140 may be used during forming of redistribution lines, one or more other features, or combinations thereof. By way of comparison, conventionally fabricated semiconductor devices may be fabricated with an initial mask material having a greater height than the mask structure described herein since, the height of the conventional mask material may be reduced during various etching, formation, and patterning acts. The mask structures described herein may have a relatively shorter height. After a height of the mask structure has been reduced, additional mask material may be formed and patterned over the mask structure to increase a height of the mask structure to a desired height. Accordingly, features of the semiconductor device 100 may be formed with a mask structure having a lower height than conventional mask materials used during semiconductor fabrication, which lower height may facilitate formation of features with a more uniform pattern, reduced spacer width roughness, reduced line width roughness, and reduced tapering.

Figure 2A:
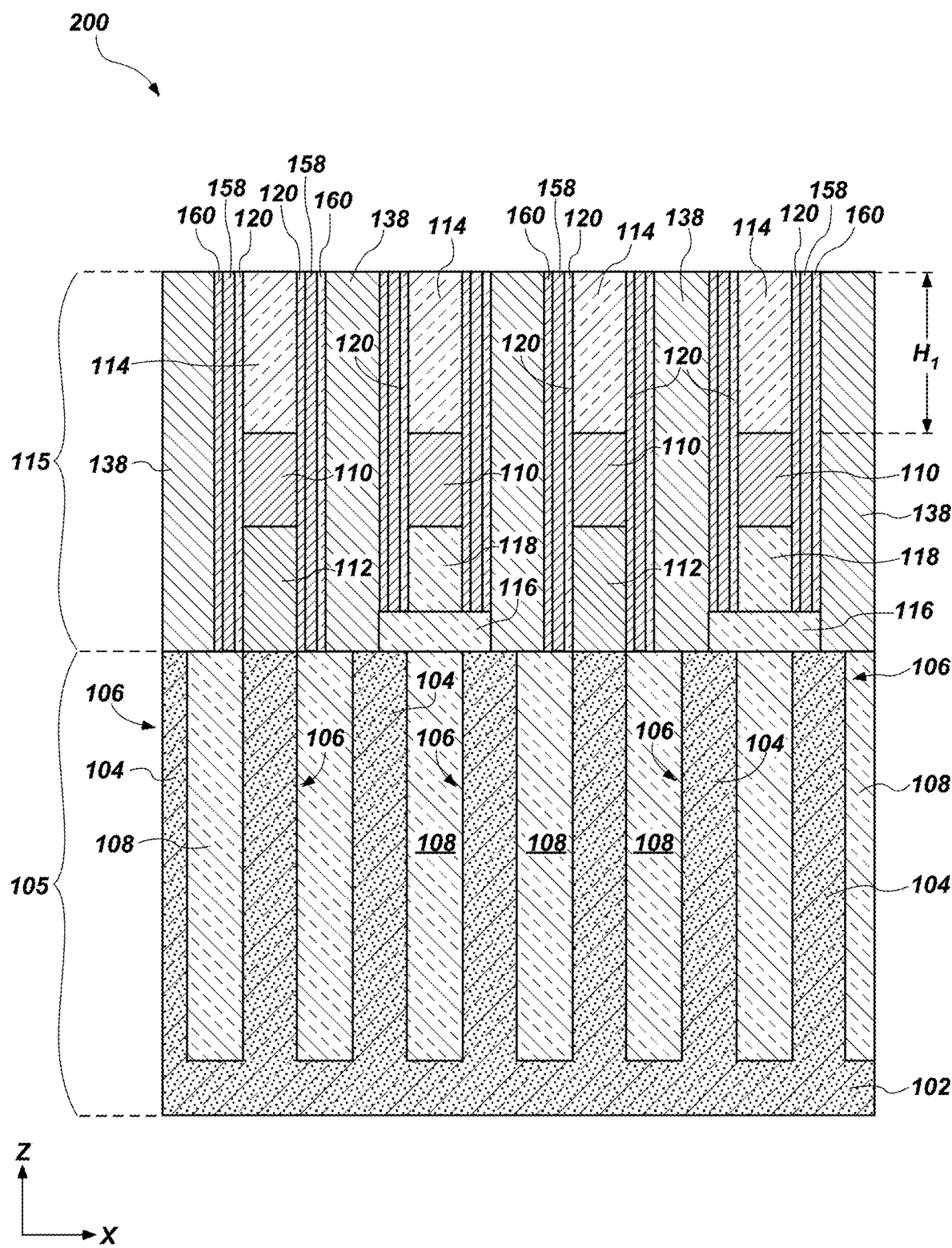
FIG. 2A through FIG. 2E are simplified cross-sectional views of another semiconductor device during various fabrication acts and illustrate a method of forming the semiconductor device, in accordance with additional embodiments of the disclosure.

FIG. 2A through FIG. 2E illustrate another method of forming a semiconductor device 200, in accordance with other embodiments of the disclosure. Referring to FIG. 2A, fabrication of the semiconductor device 200 may proceed as described above with reference to FIG. 1A and FIG. 1B. With reference to FIG. 2A, the semiconductor device 200 may be substantially the same as the semiconductor device 100 described above with reference to FIG. 1A, except that the semiconductor device 200 may include a second liner 158 adjacent to the liner 120 and a third liner 160 adjacent to the second liner 158.

The second liner 158 may be formed within the openings 122 (FIG. 1A). The second liner 158 may comprise an electrically insulative material. In some embodiments, the second liner 158 comprises the same material as the liner 120. In other embodiments, the second liner 158 comprises a different material than the liner 120. In some embodiments, the liner 120 comprises a nitride material (e.g., silicon nitride) and the second liner 158 comprises an oxide material (e.g., silicon dioxide). In other embodiments, the liner 120 comprises an oxide material and the second liner 158 comprises a nitride material.

The second liner 158 may be formed by a suitable deposition method. By way of nonlimiting example, the second liner 158 may be formed by atomic layer deposition (ALD), chemical vapor deposition (CVD), physical vapor deposition (PVD), low pressure chemical vapor deposition (LPCVD), plasma enhanced chemical vapor deposition (LPCVD), another method, or combinations thereof.

The third liner 160 may be formed over the second liner 158. The third liner 160 may be formed by, for example, ALD, CVD, PVD, LPCVD, PECVD, or another method. The third liner 160 may comprise a material different than the second liner 158. In some embodiments, the third liner 160 comprises the same material as the liner 120. By way of nonlimiting example, the liner 120 and the third liner 160 may comprise silicon nitride and the second liner 158 may comprise silicon dioxide.

The semiconductor device 200 may include the electrically conductive material 138 filling the openings 122 (FIG. 1A). In some embodiments, the electrically conductive material 138 may substantially fill the openings.

Figure 2B:
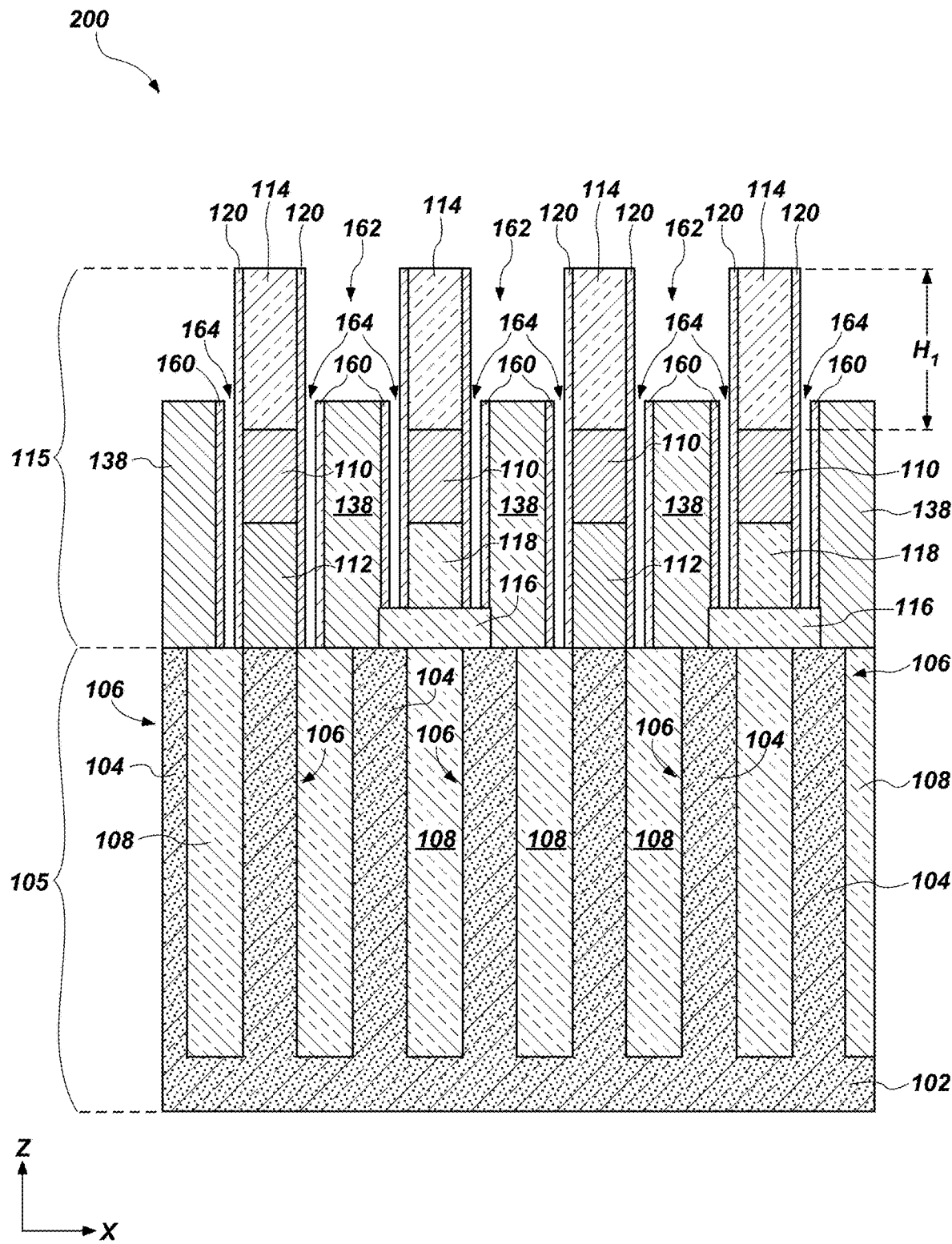

Referring to FIG. 2B, a portion of the electrically conductive material 138, at least a portion of the third liner 160, and a portion of the second liner 158 may be removed to form recesses 162. Portions of the electrically conductive material 138 may be removed by, for, example, exposing the electrically conductive material 138 to a reactive ion etching process. By way of nonlimiting example, the electrically conductive material 138 may be exposed to a fluorine-containing plasma (e.g., a plasma including $NF_3$, $F_2$, hydrogen fluoride, bromine trifluoride, chlorine trifluoride, nitride trifluoride, sulfur hexafluoride, and xenon difluoride, and combinations thereof), hydrogen, another gas, or combinations thereof. In other embodiments, portions of the electrically conductive material 138 may be removed with a wet etchant, such as, for example, a solution including hydrogen peroxide, hydrofluoric acid, nitric acid, aqua regia, sulfuric acid, hydrochloric acid, a mixture of acetic acid and hydrogen peroxide, other etchants, or combinations thereof.

In some embodiments, after removing the portion of the electrically conductive material 138, a portion of the third liner 160 may be removed. In some embodiments, the third liner 160 may be removed with a removal chemistry formulated and configured to selectively remove the third liner 160 without substantially removing the second liner 158. After removing the portion of the third liner 160, at least a portion (e.g., substantially all) of the second liner 158 may be removed. The second liner 158 may be removed with a removal chemistry (e.g., etch chemistry) formulated and configured to remove the second liner 158 without substantially removing the liner 120 or the third liner 160. In some embodiments, removal of the second liner 158 may form a gap 164 between the liner 120 and the third liner 160.

Figure 2C:
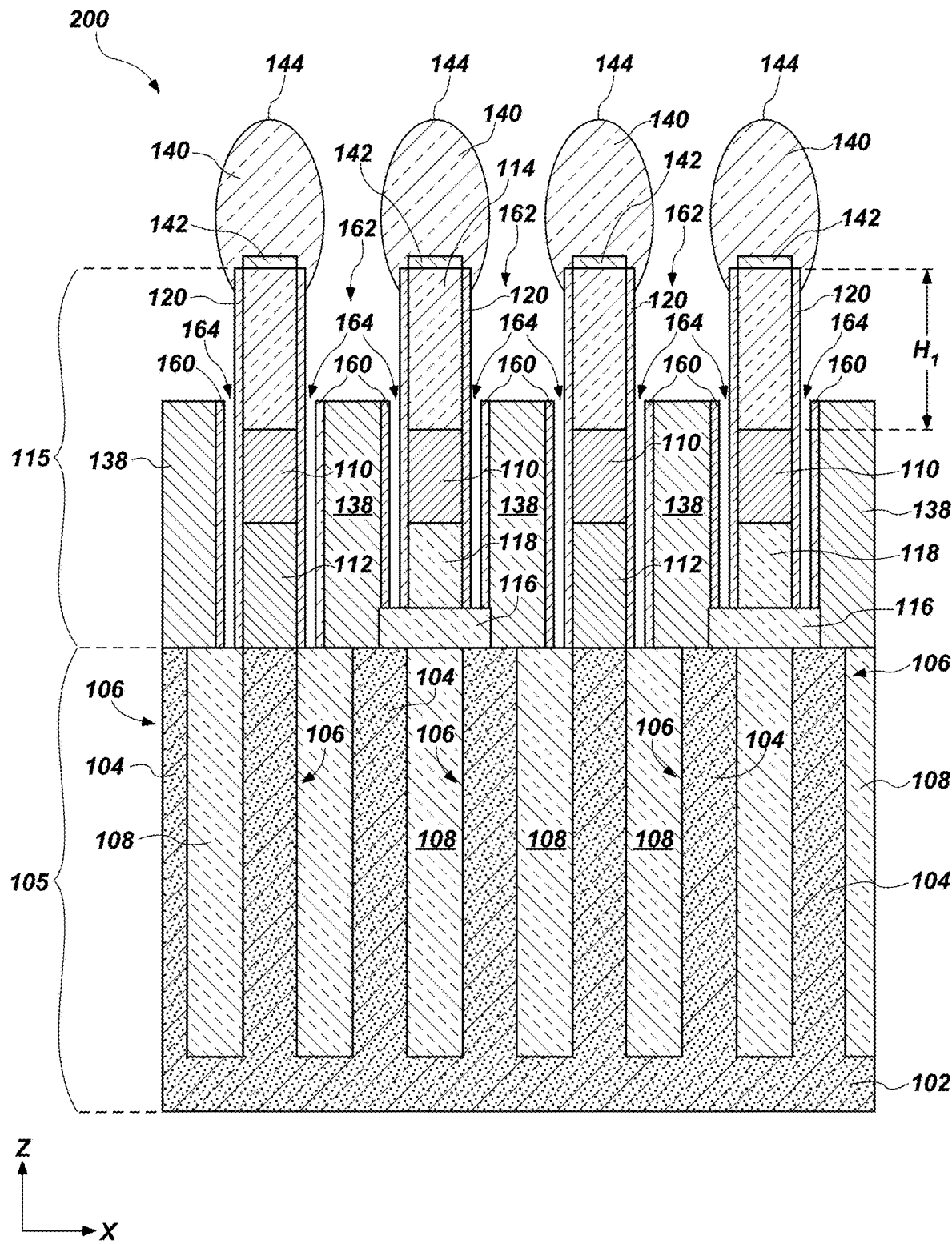

With reference to FIG. 2C, an additional mask material 140 may be formed over the mask material 114. The additional mask material 140 may be substantially the same, and may be formed by substantially the same methods, as the additional mask material 140 described above with reference to FIG. 1E. In some embodiments, the additional mask material 140 comprises silicon nitride and is formed by physical vapor deposition.

The additional mask material 140 may have an arcuate surface 144 and may have a cross-sectional shape having the arcuate surface 144. An interface 142 between the mask material 114 and the additional mask material 140 may be the same as described above with reference to FIG. 1E. The interface 142 may exhibit a different composition than each of the mask material 114 and the additional mask material 140. In some embodiments, the interface 142 may exhibit a greater atomic percent of oxygen than either of the mask material 114 and the additional mask material 140. In some embodiments, the interface 142 comprises silicon oxynitride.

Figure 2D:
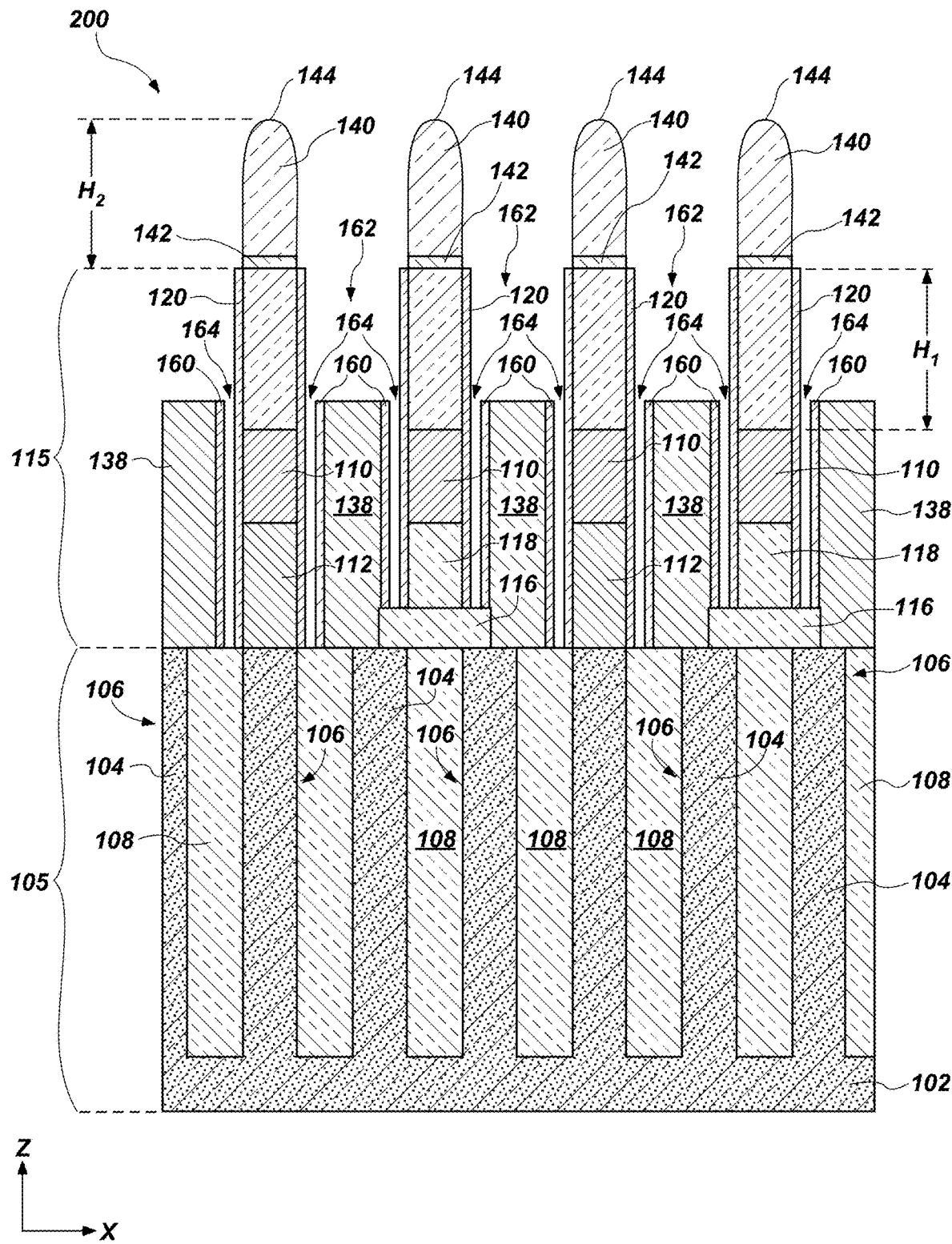

Referring to FIG. 2D, the additional mask material 140 may be exposed to a removal chemistry (e.g., an etch chemistry, a trimming chemistry) to reduce a width of the additional mask material 140 to be substantially equal to about the width of the mask material 114 and to form a mask structure comprising the additional mask material 140 and the mask material 114. The width of the additional mask material 140 may be reduced as described above with reference to FIG. 1F. By way of nonlimiting example, the removal chemistry may comprise a gas comprising $CF_4$, $CH_3F$, $H_2$, $O_2$, HBr, $Cl_2$, $SF_6$, fluorocarbon gas, another gas, or combinations thereof. As described above, exposing the additional mask material 140 to the removal chemistry may maintain a substantially uniform critical dimension of the additional mask material 140 and the mask material 114.

Figure 2E:
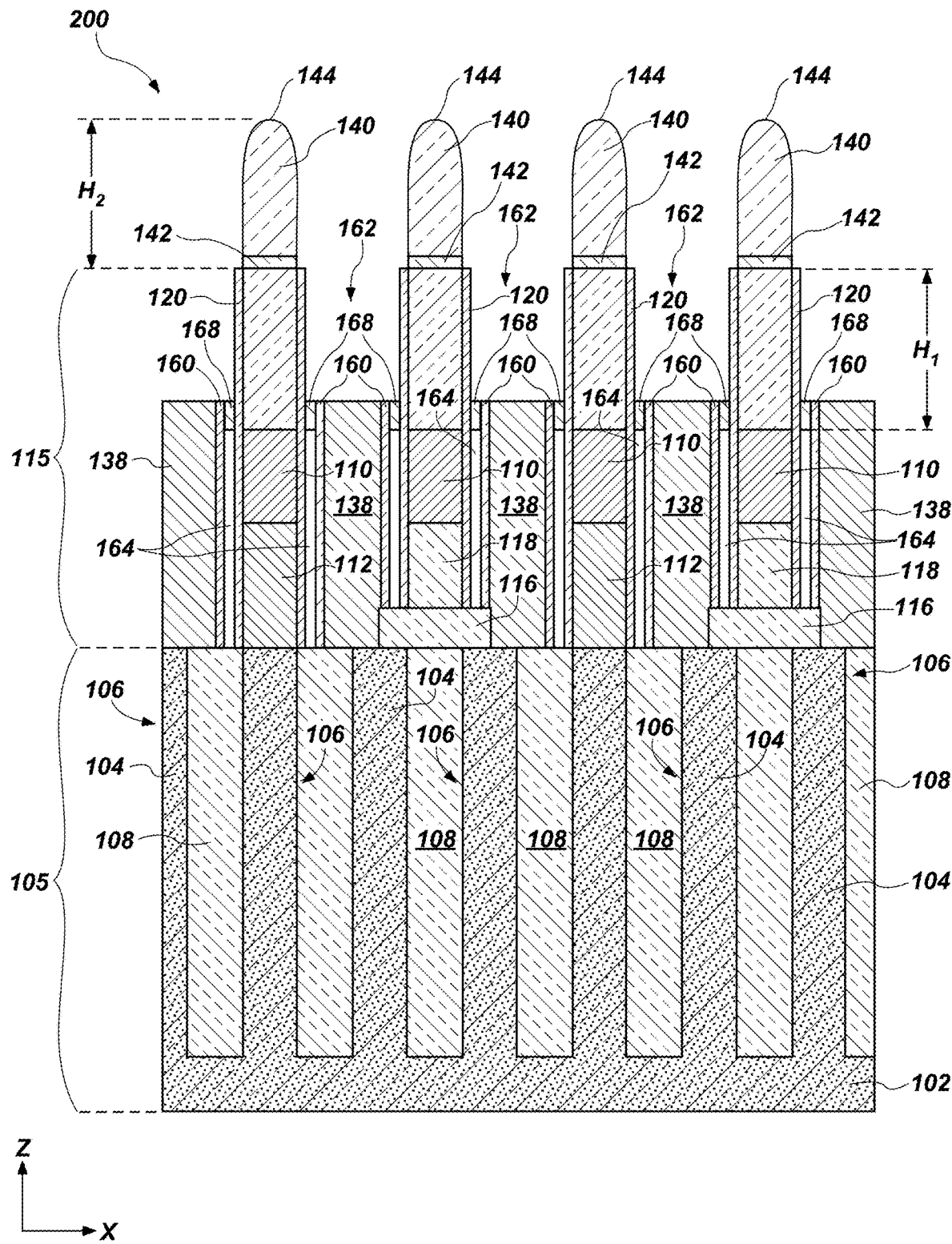

Referring to FIG. 2E, a sealant material 168 may be formed over a portion of the semiconductor device 200. The sealant material 168 may be formed by ALD, CVD, PVD, LPCVD, PECVD, or a combination thereof. In some embodiments, the sealant material 168 is formed substantially conformally and seals the gap 164 adjacent to the electrically conductive material 138. In some embodiments, the sealant material 168 may be formed within a portion of the gap 164, while at least a portion of the gap 164 remains.

The sealant material 168 may comprise a material having a relatively low dielectric constant. In some embodiments, the sealant material 168 has a lower dielectric constant than the mask material 114. In some embodiments, the sealant material 168 comprises silicon nitride having a first dielectric constant and the mask material 114 comprises silicon nitride having a second dielectric constant that is greater than the first dielectric constant. In some embodiments, the sealant material 168 may exhibit a greater porosity and a lower density than the mask material 114. In some embodiments, the dielectric constant of the sealant material 168 may be less than about 3.9. In yet other embodiments, the sealant material comprises porous silicon dioxide having a dielectric constant less than about 3.9. In further embodiments, the sealant material 168 comprises silicon dioxide doped with carbon, such as between about 2 atomic percent and about 20 atomic percent carbon.

After conformally forming the sealant material 168, the sealant material 168 may be removed from at least some surfaces of the semiconductor device 200. The sealant material 168 may be removed from surfaces of the semiconductor device 200 by, for example, reactive ion etching.

The portion of the sealant material 168 may remain within the gap 164. For example, a top portion of the gap 164 may be closed with the sealant material 168 which may remain after removal of the portions of the sealant material 168 from other surfaces of the semiconductor device 200.

The gap 164 may remain between the third liner 160 and the liner 120 at lower portions of the electrically conductive material 138. Stated another way, the gap 164 may be located laterally between the electrically conductive line 110 and the electrically conductive material 138. The gap 164 may be referred to herein as a so-called "air gap" or a "void."

After forming the sealant material 168, capacitor structures, such as the capacitor structures 150 described above with reference to FIG. 1G may be formed within the recesses 162. The capacitors may be substantially the same as the capacitor structures 150 described above with reference to FIG. 1G. The capacitor structures may be formed while the additional mask material 140 overlies the mask material 114 and through the pattern of the additional mask material 140.

Accordingly, in at least some embodiments, a method of forming a semiconductor device comprises patterning a mask material adjacent to an array of transistors, forming an electrically conductive material between adjacent portions of the patterned mask material, forming an additional mask material over the patterned mask material to form a mask structure, the additional mask material having an arcuate cross-sectional shape, removing a portion of the additional mask material to reduce a spacing between adjacent portions of the additional mask material, and forming capacitor structures in openings between the mask structure.

Accordingly, in at least other embodiments, a method of forming a semiconductor device comprises forming a mask material having a pattern over a base material, forming a material through the mask material, wherein forming the material through the mask material comprises reducing a dimension of the mask material, forming additional mask material adjacent to the mask material to increase the dimension of the mask material, and removing a portion of the additional mask material to have a lateral width substantially equal to about a lateral width of the mask material.

Accordingly, in at least some embodiments, a semiconductor device comprises features arranged in a base material, and a mask structure adjacent to the features. The mask structure comprise a first portion, a second portion adjacent the first portion, and an interface between the first portion and the second portion, the interface comprising a higher atomic percent of oxygen than the first portion and the second portion.

Figure 3:
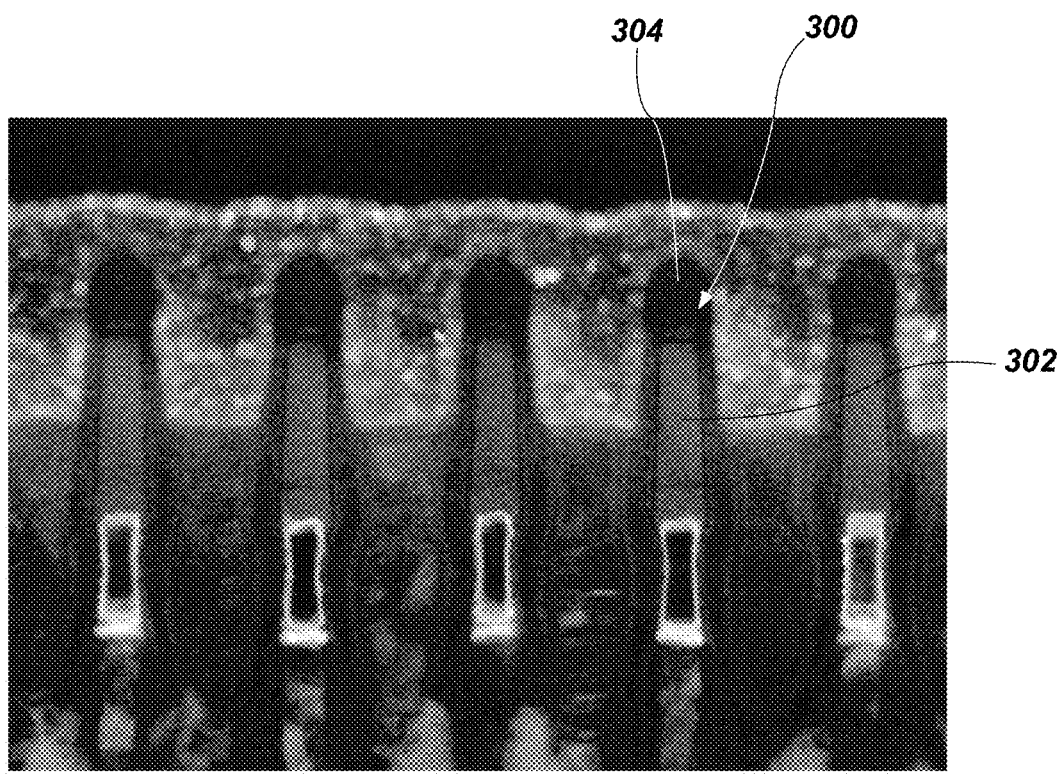
FIG. 3 is a scanning electron microscope image of a structure including an interface between a first portion and a second portion, in accordance with additional embodiments of the disclosure.

FIG. 3 is a scanning electron microscope (SEM) of a structure including an interface 300 between a first portion 302 and a second portion 304. The first portion 302 and the second portion 304 comprise silicon nitride. The interface 300 comprises silicon nitride with oxygen therein (e.g., silicon oxynitride). Accordingly, the interface 300 comprises a higher atomic percent of oxygen than the first portion 302 and the second portion 304.

Figure 4:
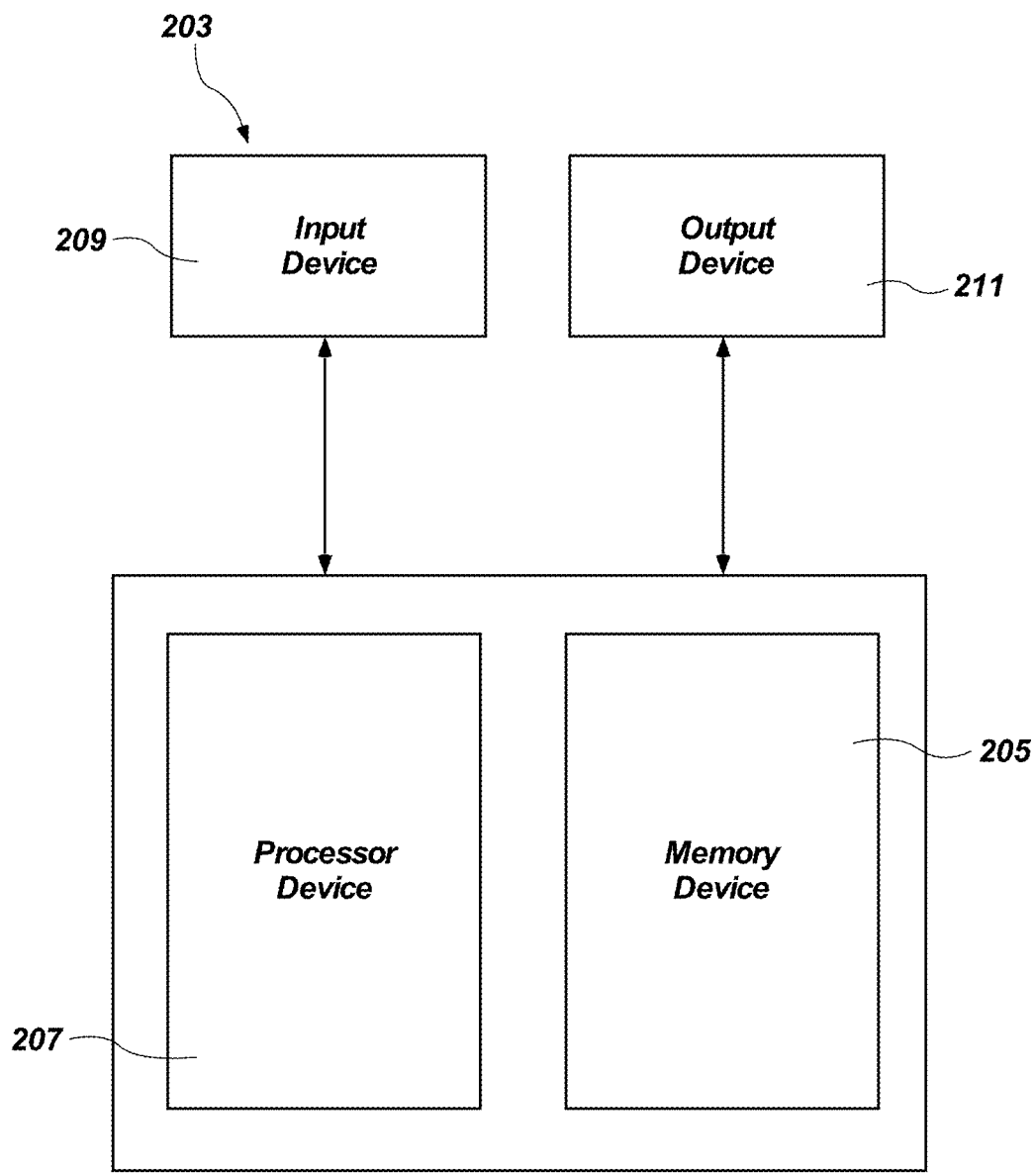
FIG. 4 is a schematic block diagram of an electronic system, in accordance with an embodiment of the disclosure.

Semiconductor devices (e.g., the semiconductor device 100, the semiconductor device 200) including the mask structures (e.g., the mask material 114 and the additional mask material 140) in accordance with embodiments of the disclosure may be used in embodiments of electronic systems of the disclosure. For example, FIG. 4 is a block diagram of an illustrative electronic system 203 according to embodiments of disclosure. The electronic system 203 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 203 includes at least one memory device 205. The memory device 205 may include, for example, an embodiment of a semiconductor device previously described herein (e.g., the semiconductor device 100, the semiconductor device 200) including the mask structures (e.g., the mask material 114 and the additional mask material 140).

The electronic system 203 may further include at least one electronic signal processor device 207 (often referred to as a "microprocessor"). The electronic signal processor device 207 may, optionally, include an embodiment of a semiconductor device previously described herein (e.g., the semiconductor device 100, the semiconductor device 200). The electronic system 203 may further include one or more input devices 209 for inputting information into the electronic system 203 by a user, such as, for example, a mouse or other pointing device, a keyboard, a touchpad, a button, or a control panel. The electronic system 203 may further include one or more output devices 211 for outputting information (e.g., visual or audio output) to a user such as, for example, a monitor, a display, a printer, an audio output jack, a speaker, etc. In some embodiments, the input device 209 and the output device 211 may comprise a single touchscreen device that can be used both to input information to the electronic system 203 and to output visual information to a user. The input device 209 and the output device 211 may communicate electrically with one or more of the memory device 205 and the electronic signal processor device 207. In some embodiments, more than one function may be performed by a single semiconductor die, for example in the case of a system on a chip (SoC), wherein processor and memory functions are incorporated in a single die.

Thus, in accordance with embodiments of the disclosure, a system comprises at least one processor device operably coupled to at least one input device and at least one output device, and a semiconductor device operably coupled to the at least one processor device. The semiconductor device comprises transistors patterned in a base material, the transistors comprising gate electrodes extending in a direction, and a mask material patterned over the transistors and having a different pattern that the transistors. The mask material comprises a first portion, a second portion adjacent the first portion, and an interface between the first portion and the second portion, the interface having a higher atomic percent of oxygen than the first portion and the second portion.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a semiconductor device, the method comprising:
   patterning a mask material adjacent to an array of transistors to form a patterned mask material, the array of transistors comprising a pattern of semiconductive material, different portions of the patterned mask material spaced from each other by openings;
   after forming the patterned mask material, forming an electrically conductive material in the openings between the adjacent portions of the patterned mask material and over the array of transistors;
   after forming the electrically conductive material, forming an additional mask material directly on the patterned mask material to form a mask structure, the additional mask material having an arcuate cross-sectional shape;
   removing a portion of the additional mask material to increase a spacing between adjacent portions of the additional mask material; and
   forming capacitor structures in openings between the mask structure.

2. The method of claim 1, wherein patterning a mask material adjacent to an array of transistors comprises patterning a mask material comprising silicon nitride.

3. The method of claim 1, wherein patterning a mask material adjacent to an array of transistors comprises patterning the mask material to have a height of between about 500 Å and about 1,500 Å.

4. The method of claim 1, wherein removing a portion of the additional mask material comprises exposing the additional mask material to a gas comprising $CF_4$, $CH_3F$, $H_2$, $O_2$, HBr, $Cl_2$, $SF_6$, or combinations thereof.

5. The method of claim 1, wherein forming an additional mask material directly on the patterned mask material comprises forming an interface between the patterned mask material and the additional mask material, the interface comprising a higher atomic percent of oxygen than the patterned mask material and the additional mask material.

6. The method of claim 1, wherein forming an additional mask material directly on the patterned mask material comprises forming a portion of the additional mask material below an upper surface of the patterned mask material.

7. The method of claim 1, wherein patterning a mask material adjacent to an array of transistors comprises forming the mask material over electrically conductive lines extending over the array of transistors.

8. The method of claim 1, further comprising removing at least a portion of the electrically conductive material prior to forming the additional mask material.

9. The method of claim 8, further comprising forming a dielectric material having a dielectric constant less than about 3.9 between portions of the electrically conductive material and electrically conductive lines located adjacent to the patterned mask material, the dielectric material electrically isolating the electrically conductive material from the electrically conductive lines.

10. The method of claim 1, wherein forming an additional mask material directly on the patterned mask material comprises forming at least about 100 Å of the additional mask material over the patterned mask material.

11. The method of claim 1, wherein forming an additional mask material directly on the patterned mask material comprises forming the additional mask material by physical vapor deposition.

12. The method of claim 1, wherein forming an additional mask material directly on the patterned mask material comprises forming the additional mask material directly on the patterned mask material, spaces between adjacent portions of the mask structure defined by the openings.

13. The method of claim 1, wherein removing a portion of the additional mask material to increase a spacing between adjacent portions of the additional mask material comprises reducing a width of the additional mask material to be substantially the same as a width of the patterned mask material.

14. A method of forming a semiconductor device, the method comprising:
   forming a mask material having a pattern over a base material;
   forming a material through the mask material, wherein forming the material through the mask material comprises reducing a height of the mask material;

after reducing the height of the mask material, forming additional mask material directly on the mask material to form a mask structure having a height greater than a height of the mask material, the additional mask material extending vertically above an uppermost surface of the mask material and comprising portions spaced from each other by gaps; and removing a portion of the additional mask material to have a lateral width substantially equal to about a lateral width of the mask material.

15. The method of claim 14, wherein forming additional mask material directly on the mask material comprises forming about 150 Å of the additional mask material over the mask material.

16. The method of claim 14, wherein:
forming the mask material comprises forming silicon nitride; and
forming the additional mask material comprises forming silicon nitride.

17. A semiconductor device, comprising:
a pattern of electrically conductive lines; and
a mask structure over the electrically conductive lines of the pattern of electrically conductive lines, the mask structure comprising:
a first portion;
a second portion adjacent the first portion;
an interface between the first portion and the second portion, the interface comprising a higher atomic percent of oxygen than the first portion and the second portion; and
a liner adjacent the first portion, the second portion, the interface, and the electrically conductive lines.

18. The semiconductor device of claim 17, wherein the first portion and the second portion of the mask structure comprise silicon nitride.

19. The semiconductor device of claim 17, wherein the second portion of the mask structure has an arcuate cross-sectional shape.

20. The semiconductor device of claim 17, wherein an aspect ratio of the mask structure is greater than about 10:1.

21. The semiconductor device of claim 17, wherein the interface comprises silicon oxynitride.

22. The semiconductor device of claim 17, further comprising an electrically conductive material adjacent to the electrically conductive lines, another liner adjacent the electrically conductive material, a gap between the liner and the another liner.

23. A system, comprising:
at least one processor device operably coupled to at least one input device and at least one output device; and
a semiconductor device operably coupled to the at least one processor device, the semiconductor device comprising:
transistors patterned in a base material, the transistors comprising gate electrodes extending in a direction; and
a mask structure patterned over the transistors and having a different pattern than the transistors, the mask material comprising a first portion comprising silicon nitride, a second portion comprising the same material composition as the first portion adjacent the first portion, and an interface between the first portion and the second portion, the interface having a higher atomic percent of oxygen than the first portion and the second portion and comprising from about 0.1 atomic percent to about 5.0 atomic percent oxygen.

* * * * *